(12) United States Patent
Deskin et al.

(10) Patent No.: US 7,724,022 B1
(45) Date of Patent: May 25, 2010

(54) IMPLEMENTING ENHANCED SECURITY FEATURES IN AN ASIC USING EFUSES

(75) Inventors: Brian P. Deskin, Vestal, NY (US);
William E. Hall, Clinton, CT (US);
David W. Pruden, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/361,220

(22) Filed: Jan. 28, 2009

(51) Int. Cl.
*H03K 19/00* (2006.01)
(52) U.S. Cl. .................. 326/8; 326/9; 326/16; 326/37
(58) Field of Classification Search ............. 326/8–9, 326/14, 16, 37–38
See application file for complete search history.

(56) References Cited

U.S. PATENT DOCUMENTS 5,936,970 A * 8/1999 Lee ............................. 714/710

2008/0283963 A1 * 11/2008 Chung et al. ................. 257/529

* cited by examiner

*Primary Examiner*—Anh Q Tran
(74) *Attorney, Agent, or Firm*—Joan Pennington

(57) ABSTRACT

A method and eFuse circuit for implementing enhanced security features using eFuses, such as disabling selected predefined test, debug, and mission security functions used in application-specific integrated circuits (ASICs), and a design structure on which the subject circuit resides are provided. The eFuse circuit includes a plurality of eFuses, a sense amplifier coupled to the plurality of eFuses, and a plurality of sense output latches coupled to the sense amplifier. The plurality of sense output latches is arranged to have a bias to power up to a known value. Control logic coupled to the plurality of sense output latches provides at least one predefined control signal responsive to the known value of the plurality of sense output latches, which enables a selected predefined security function. The plurality of eFuses is sensed and the ASIC is configured to a predefined state responsive to an applied POR/Sense control signal.

20 Claims, 2 Drawing Sheets

IMPLEMENTING ENHANCED SECURITY FEATURES IN AN ASIC USING EFUSES

FIELD OF THE INVENTION

The present invention relates generally to the data processing field, and more particularly, relates to a method and circuit for using eFuses to implement enhanced security features, such as to disable selected predefined functions, for example, test, debug, and mission that are used in application-specific integrated circuits (ASICs), and a design structure on which the subject circuit resides.

DESCRIPTION OF THE RELATED ART

Electronic Fuses (eFuses) are currently used in very large scale integrated (VLSI) chips and application-specific integrated circuits (ASICs), to be programmed for various reasons. For example, eFuses are currently used to configure elements after the silicon masking and fabrication process. eFuses are used to configure circuits for customization or to correct silicon manufacturing defects and increase manufacturing yield. eFuses are used for invoking redundant elements in memory arrays for repairing failing locations or programming identification information.

Using eFuses is a desirable and effective way to control security related characteristics of ASICs, such as test, debug, keys and the like. However, a basic problem in known systems is that an eFuse value is not affective until it is sensed by a defined power-on-reset (POR) sequence. If this POR sequence is avoided, the output of the eFuse macro is defined as being unknown.

As a result if the POR/Sense operation is deactivated, then there is, for example, an unacceptable increased security risk of improper or unauthorized use of the manufacturing test scan rings and any JTAG test/debug and RISCWatch debugger functions that should have been disabled by the eFuses if the normal POR sequence were applied. This also applies to various other types of nonvolatile storage that require a sense operation to read a programmed value for use in the configuration of a system.

A need exists for an effective mechanism for implementing enhanced security features using electronic fuses (eFuses). For example, in certain high security applications, it is desirable to use eFuses to implement enhanced security features, such as to disable selected predefined functions for test, debug, and mission that are used in application-specific integrated circuits (ASICs).

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

SUMMARY OF THE INVENTION

Principal aspects of the present invention are to provide a method and circuit for implementing enhanced security features using eFuses in application-specific integrated circuits (ASICs), and a design structure on which the subject circuit resides. Other important aspects of the present invention are to provide such method, circuit and design structure substantially without negative effect and that overcome many of the disadvantages of prior art arrangements.

In brief, a method and eFuse circuit for implementing enhanced security features using eFuses, such as to disable selected predefined security functions, for example, test, debug, and mission that are used in application-specific integrated circuits (ASICs), and a design structure on which the subject circuit resides are provided. The eFuse circuit includes a plurality of eFuses, a sense amplifier coupled to the plurality of eFuses, and a plurality of sense output latches coupled to the sense amplifier. The plurality of sense output latches is arranged to have a bias to power up to a known value. Control logic coupled to the plurality of sense output latches provides at least one predefined control signal responsive to the known value of the plurality of sense output latches. The control signal enables a selected predefined security function.

In accordance with features of the invention, a power-on-reset (POR) sense control signal is applied to the sense amplifier and the plurality of sense output latches. The plurality of eFuses is sensed and the ASIC is configured to a predefined state responsive to the applied POR/Sense control signal.

In accordance with features of the invention, the sense output latches are arranged to have a bias to power up to a "one", which is a burned or programmed value of an eFuse. The predefined control signal provided responsive to the known value of the plurality of sense output latches disables selected predefined functions. The disabled selected predefined functions include, for example, test, debug, and mission functions used in an ASIC.

In accordance with features of the invention, the configured predefined state of the ASIC responsive to the applied POR/Sense control signal includes an initial state for a new chip, such as, providing the sense output latches to a "zero", which is an unburned or unprogrammed value of the eFuse. The configured predefined state of the ASIC responsive to the applied POR/Sense control signal includes a customer programmed state for a chip, such as, providing the sense output latches to a "one", which is a burned or programmed value of an eFuse.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and an eFuse circuit for implementing enhanced security features using eFuses in application-specific integrated circuits (ASICs), and a design structure on which the subject circuit resides are provided. The method and the eFuse circuit provides sense output latches that hold a copy of the eFuse value and are arranged to have a bias to power up to a known value, such as, a "one", which is a burned or programmed value of an eFuse. The method and the eFuse circuit effectively forces all eFuse sense latches and thus all security characteristics to be placed in a known state, which is preferably a most conservative state, that is disabling predefined functions, such as test, debug and the like, between the initial application of system power and the assertion of power-on-reset (POR) of the ASIC. At POR eFuses are sensed, at which point the ASIC is configured to an initial state for new chips or a customer programmed state for programmed chips or field operational chips.

Figure 1:
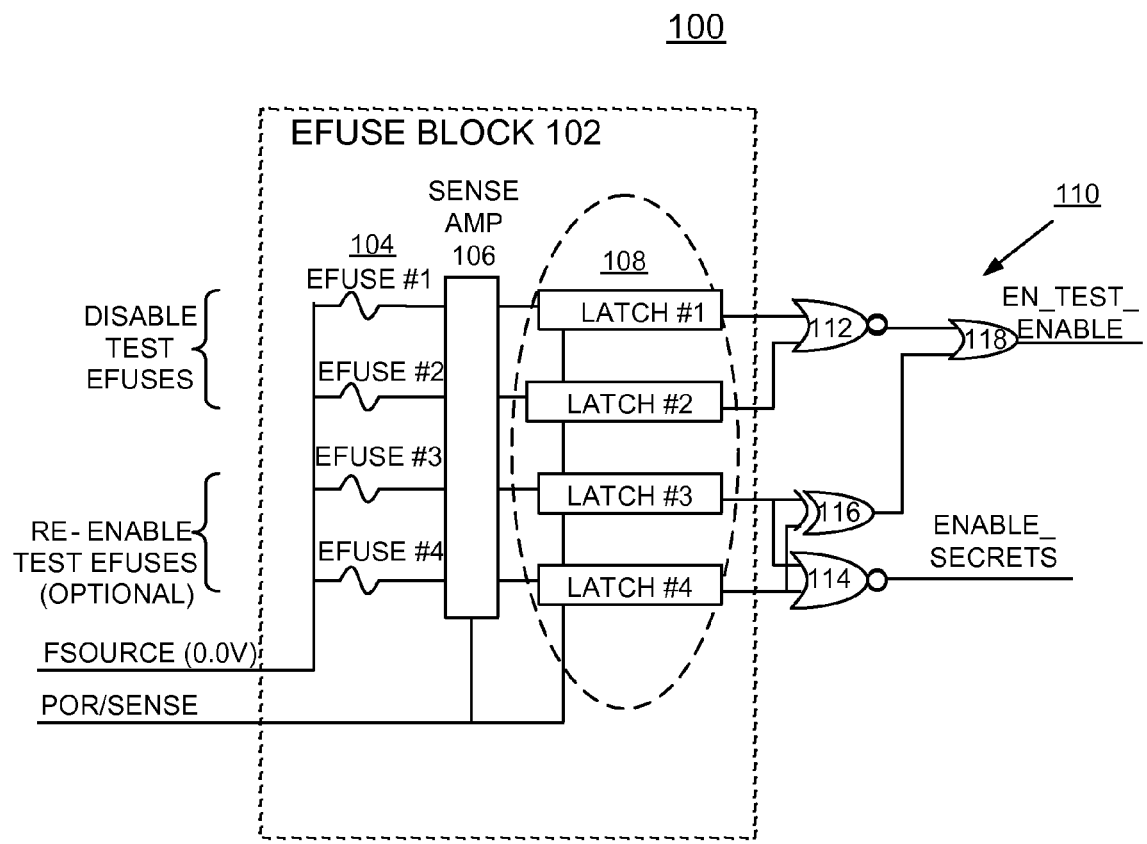
FIG. 1 is a schematic and block diagram representation of an eFuse circuit for implementing enhanced security features using eFuses in application-specific integrated circuits (ASICs) in accordance with the preferred embodiment.

Having reference now to the drawings, in FIG. 1, there is shown an eFuse circuit for implementing enhanced security features using eFuses in application-specific integrated circuits (ASICs) generally designated by the reference character 100 in accordance with the preferred embodiment.

The eFuse circuit 100 includes an eFuse block 102 or multiple eFuse blocks 102, each including a plurality of eFuses 104, #1-#4, as shown. A first pair of disable test eFuses 104, #1-#2 are provided for test disable, and a second optional pair of re-enable test eFuses 104, #3-#4 optionally are provided for test re-enable. The pair of two disable test eFuses 104, #1-#2 are required for eFuse reliability. The second optional pair of two re-enable test eFuses 104, #3-#4 are required for eFuse function and reliability.

It should be understood that the present invention is not limited to the illustrated embodiment, for example, one eFuse 104 or more than two eFuses 104 could be use to achieve both the disable and re-enable functions.

The eFuse circuit 100 includes a sense amplifier 106 coupled to the plurality of eFuses 104, #1-#4 and a plurality of sense output latches 108, #1-#4. A voltage rail input FSOURCE (0.0V) is connected to a first end of the eFuses 104, #1-#4. A power-on-reset (POR) input POR/SENSE is applied to the sense amplifier 106 and the plurality of sense output latches 108, #1-#4. The plurality of sense output latches 108, #1-#4 of the preferred embodiment are changed to have a bias to power up at "1 s", representing the programmed or burned state of eFuses 104, #1-#4.

A logic control circuit generally designated by the reference character 110 is connected to the plurality of sense output latches 108, #1-#4, providing control signals EN_TEST_ENABLE, and ENABLE_SECRETS, as shown.

The logic control circuit 110 includes a plurality of NOR gates 112, 114, an exclusive OR (XOR) gate 116, and an OR gate 118, connected together as shown. The sense output latches 108, #1-#2 provide first and second inputs to the NOR gate 112. The sense output latches 108, #3-#4 provide first and second inputs to the NOR gate 114 and provide first and second inputs to the exclusive OR gate 116. The output of NOR gate 114 provides a first input to the OR gate 118 and the output of XOR gate 116 provides a second input to the OR gate 118.

In accordance with features of the invention, the plurality of sense output latches 108, #1-#4 is arranged to have a bias to power up to a known value.

Control logic 110 coupled to the plurality of sense output latches 108, #1-#4 provides at least one predefined control signal responsive to the known value of the plurality of sense output latches. The control signal enables a selected predefined security function. Examples of operation of the control logic 110 follow.

The output of OR gate 118 provides the control signal EN_TEST_ENABLE. The output of NOR gate 114 provides the control signal ENABLE_SECRETS. In the time period between an initial application of system power and the assertion of power-on-reset (POR) to the ASIC, all test latches 108, #1-#4 are initialized to the eFuse burned state, such as a high level or one. The control signal EN_TEST_ENABLE is disabled and the control signal ENABLE_SECRETS is disabled.

It should be understood that the present invention is not limited to the disable and re-enable test latches 108, #1-#4 being a one value, the eFuse sense latch value could be defined at a zero, where the burned or programmed eFuse value is zero, which is used to disable predefined functions. In this case, the NOR gates 112, 114 would be changed to AND gates. It should be noted that the XOR gate 116 would not be changed, since its re-enable is based on the eFuse values being different.

The eFuses 104, #1-#4 are sensed at the assertion of POR to the ASIC and the eFuse test latches 108, #1-#4 will then contain a value representing the programmed state of the sensed eFuses. An initial state for new manufactured chips is all eFuses 108, #1-#4 are unburned or not programmed. A customer programmed state is provided for programmed chips or field operational chips, which may included both programmed and unprogrammed eFuses 108, #1-#4.

After POR of a newly manufactured chip, eFuse sense latches 108, #1-#4 contain the unprogrammed state of the eFuses 104, 1#1-#4. The control signal EN_TEST_ENABLE is enabled, and the control signal ENABLE_SECRETS is enabled, which allows manufacturing test of the chip and allows the customer to use test and debug features during system development and configuration of any secrets to be contained in the ASIC. After the customer has completed the configuration and before deployment to the field, the customer burns or programs at least one, preferable all of the test disable eFuses 104, #1-#2 to disable manufacturing test and debug capabilities.

After POR of a field operational chip, eFuse sense latches 108, #1-#4 contain the programmed state of the eFuses 104, #1-2 and the unprogrammed state of the eFuses 104, #3-#4. The control signal EN_TEST_ENABLE remains disabled, and the control signal ENABLE_SECRETS is now enabled. This allows the chip to operate as intended while test and debug remain disabled.

Optionally for failure analysis of a returned field operational chip, the customer can program one of the re-enable test latches 108, #3 or #4. Then after POR of a returned field operational chip, eFuse sense latches 108, #1-#4 contain the programmed state of the eFuses 104, #1-2 and the programmed state of one of the re-enable eFuse 104, #3 or #4. The control signal EN_TEST_ENABLE is then re-enabled, while the control signal ENABLE_SECRETS remains disabled. This allows any necessary testing for failure analysis while preventing access to the secrets, and prevents later use of the chip in an operational system with test re-enabled.

Any attempts at unauthorized access or use of chips that have had test re-enabled through programming of additional re-enable eFuses 104, #3 or #4, will result in the POR sense of the eFuses forcing both of the control signals EN_TEST_ENABLE and ENABLE_SECRETS to remain disabled.

Figure 2:
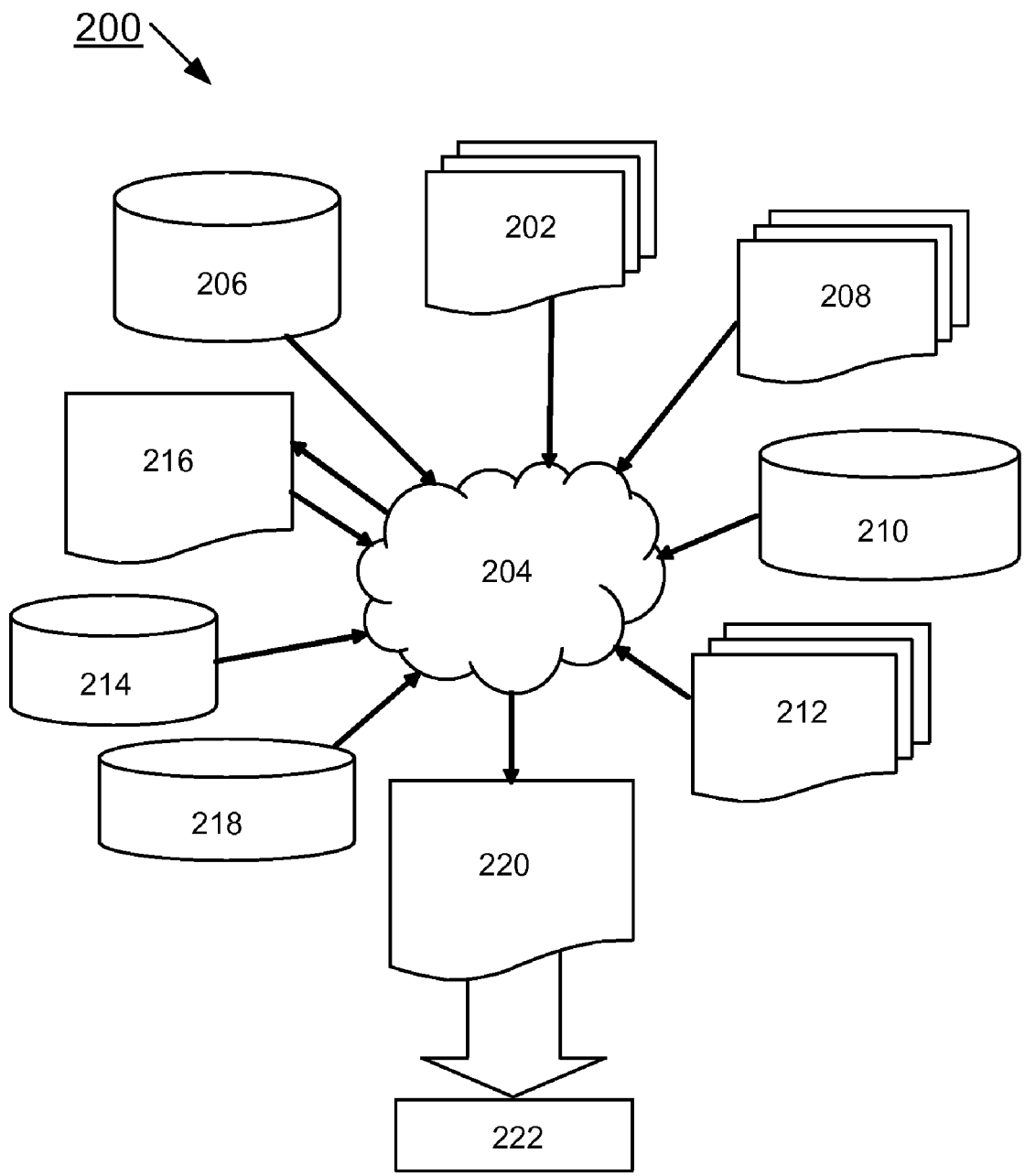
FIG. 2 is a flow diagram of a design process used in semiconductor design, manufacturing, and/or test.

FIG. 2 shows a block diagram of an example design flow 200. Design flow 200 may vary depending on the type of IC being designed. For example, a design flow 200 for building an application specific IC (ASIC) may differ from a design flow 200 for designing a standard component. Design structure 202 is preferably an input to a design process 204 and may come from an IP provider, a core developer, or other design company or may be generated by the operator of the design flow, or from other sources. Design structure 202 comprises circuit 100 in the form of schematics or HDL, a hardware-description language, for example, Verilog, VHDL, C, and the like. Design structure 202 is tangibly contained on, for example, one or more machine readable medium. For example, design structure 202 may be a text file or a graphical representation of circuit 100. Design process 204 preferably synthesizes, or translates, circuit 100 into a netlist 206, where netlist 206 is, for example, a list of wires, transistors, logic gates, control circuits, I/O, models, etc. that describes the connections to other elements and circuits in an integrated circuit design and recorded on at least one of machine readable medium. This may be an iterative process in which netlist 206 is resynthesized one or more times depending on design specifications and parameters for the circuit.

Design process 204 may include using a variety of inputs; for example, inputs from library elements 208 which may house a set of commonly used elements, circuits, and devices, including models, layouts, and symbolic representations, for a given manufacturing technology, such as different technology nodes, 32 nm, 45 nm, 90 nm, and the like, design specifications 210, characterization data 212, verification data 214, design rules 216, and test data files 218, which may include test patterns and other testing information. Design process 204 may further include, for example, standard circuit design processes such as timing analysis, verification, design rule checking, place and route operations, and the like. One of ordinary skill in the art of integrated circuit design can appreciate the extent of possible electronic design automation tools and applications used in design process 204 without deviating from the scope and spirit of the invention. The design structure of the invention is not limited to any specific design flow.

Design process 204 preferably translates an embodiment of the invention as shown in FIG. 1 along with any additional integrated circuit design or data (if applicable), into a second design structure 220. Design structure 220 resides on a storage medium in a data format used for the exchange of layout data of integrated circuits, for example, information stored in a GDSII (GDS2), GL1, OASIS, or any other suitable format for storing such design structures. Design structure 220 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 220 may then proceed to a stage 222 where, for example, design structure 220 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. An eFuse circuit for implementing enhanced security features in an application-specific integrated circuit (ASIC) using eFuses comprising:
   a plurality of eFuses,
   a sense amplifier, said sense amplifier coupled to the plurality of eFuses,
   a plurality of sense output latches coupled to the sense amplifier; said plurality of sense output latches powering up to a known value; and
   control logic coupled to the plurality of sense output latches, said control logic providing at least one predefined control signal responsive to the known value of the plurality of sense output latches; said control signal enabling a selected predefined security function.

2. The eFuse circuit as recited in claim 1 includes a power-on-reset (POR) sense control signal; said POR/Sense control signal being applied to said sense amplifier and the plurality of sense output latches.

3. The eFuse circuit as recited in claim 2, wherein said plurality of eFuses is sensed responsive to said applied POR/Sense control signal and the ASIC is configured to a predefined state responsive to said applied POR/Sense control signal.

4. The eFuse circuit as recited in claim 1, wherein said selected predefined security function includes a test function for the ASIC.

5. The eFuse circuit as recited in claim 1, wherein said sense output latches power up to a programmed value of an eFuse.

6. The eFuse circuit as recited in claim 5, wherein said predefined control signal provided responsive to the known value of the plurality of sense output latches disables selected predefined functions.

7. The eFuse circuit as recited in claim 6, wherein said disabled selected predefined functions include disabled test functions for the ASIC.

8. The eFuse circuit as recited in claim 1, wherein said plurality of eFuses includes a pair of disable test eFuses coupled to a pair of said sense output latches by said sense amplifier.

9. The eFuse circuit as recited in claim 1, wherein said control logic includes a NOR gate having inputs coupled to said pair of said sense output latches.

10. A method for implementing enhanced security features in an application-specific integrated circuit (ASIC) using eFuses, said method comprising:
    providing a plurality of eFuses,
    providing a sense amplifier coupled to said plurality of eFuses,
    providing a plurality of sense output latches coupled to said sense amplifier; said plurality of sense output latches powering up to a known value; and
    providing at least one predefined control signal responsive to the known value of the plurality of sense output latches; said control signal enabling a selected predefined security function.

11. The method for implementing enhanced security features in an ASIC using eFuses as recited in claim 10 further includes applying a power-on-reset (POR) sense control signal to said sense amplifier and said plurality of sense output latches.

12. The method for implementing enhanced security features in an ASIC using eFuses as recited in claim 11 further includes sensing said plurality of eFuses responsive to said applied POR/Sense control signal, and configuring the ASIC to a predefined state responsive to said applied POR/Sense control signal.

13. The method for implementing enhanced security features in an ASIC using eFuses as recited in claim 10 wherein said plurality of sense output latches power up to a programmed value of an eFuse.

14. The method for implementing enhanced security features in an ASIC using eFuses as recited in claim 10 wherein said predefined control signal provided responsive to the known value of the plurality of sense output latches disables selected predefined functions.

15. The method for implementing enhanced security features in an ASIC using eFuses as recited in claim 14 includes disabling selected predefined test functions for the ASIC.

16. A design structure tangibly embodied in a machine readable medium used in a design process, the design structure comprising:

an eFuse circuit tangibly embodied in the machine readable medium used in the design process, said eFuse circuit for implementing enhanced security features in an application-specific integrated circuit (ASIC) using eFuses, said eFuse circuit including:

a plurality of eFuses, a sense amplifier, said sense amplifier coupled to the plurality of eFuses, a plurality of sense output latches coupled to the sense amplifier; said plurality of sense output latches powering up to a known value; and control logic coupled to the plurality of sense output latches, said control logic providing at least one predefined control signal responsive to the known value of the plurality of sense output latches; said control signal enabling a selected predefined security function, wherein the design structure, when read and used in the manufacture of a semiconductor chip produces a chip comprising said eFuse circuit.

17. The design structure of claim 16, wherein the design structure comprises a netlist, which describes said eFuse circuit.

18. The design structure of claim 16, wherein the design structure resides on storage medium as a data format used for the exchange of layout data of integrated circuits.

19. The design structure of claim 16, wherein the design structure includes at least one of test data files, characterization data, verification data, or design specifications.

20. The design structure of claim 16, wherein said eFuse circuit includes a power-on-reset (POR) sense control signal; said POR/Sense control signal being applied to said sense amplifier and the plurality of sense output latches; said plurality of eFuses is sensed responsive to said applied POR/Sense control signal and the ASIC is configured to a predefined state responsive to said applied POR/Sense control signal.

* * * * *